United States Patent
Bolis et al.

(10) Patent No.: US 7,393,711 B2
(45) Date of Patent: Jul. 1, 2008

(54) METHOD OF PRODUCING A DIGITAL FINGERPRINT SENSOR AND THE CORRESPONDING SENSOR

(75) Inventors: Sébastien Bolis, Grenoble (FR); Cécile Roman, Saint Nazaire les Eymes (FR)

(73) Assignee: Atmel Grenoble S.A., Saint Egreve (FR)

( * ) Notice: Subject to any disclaimer, the term of this patent is extended or adjusted under 35 U.S.C. 154(b) by 755 days.

(21) Appl. No.: 10/513,308

(22) PCT Filed: May 2, 2003

(86) PCT No.: PCT/FR03/01378

§ 371 (c)(1),
(2), (4) Date: Nov. 3, 2004

(87) PCT Pub. No.: WO03/096265

PCT Pub. Date: Nov. 20, 2003

(65) Prior Publication Data

US 2005/0180609 A1 Aug. 18, 2005

(30) Foreign Application Priority Data

May 7, 2002 (FR) .................... 02 05732

(51) Int. Cl.
*H01L 21/00* (2006.01)
*H01L 29/78* (2006.01)
(52) U.S. Cl. ................. 438/51; 438/55; 257/417; 257/467; 257/E29.324; 257/E21.502

(58) Field of Classification Search ............. 438/50, 438/51, 54, 55; 257/415, 417, 467, E29.324, 257/E21.502
See application file for complete search history.

(56) References Cited

U.S. PATENT DOCUMENTS

| | | | |
|---|---|---|---|
| 4,995,013 A | | 2/1991 | Dumaine |
| 6,331,452 B1 * | | 12/2001 | Gall ........................ 438/127 |
| 6,653,723 B2 * | | 11/2003 | Manansala ............... 257/680 |
| 6,962,282 B2 * | | 11/2005 | Manansala ............... 228/180.5 |
| 7,031,500 B1 * | | 4/2006 | Shinohara ................. 382/124 |
| 7,192,798 B2 * | | 3/2007 | Okada et al. ................ 438/51 |
| 7,315,070 B2 * | | 1/2008 | Okada et al. ............... 257/415 |

FOREIGN PATENT DOCUMENTS

| | | |
|---|---|---|
| EP | 0789334 A | 8/1997 |
| EP | 1136936 | 9/2001 |
| JP | 61 032535 A | 2/1986 |
| WO | 02 069386 A | 9/2002 |

* cited by examiner

*Primary Examiner*—David A Zarneke
(74) *Attorney, Agent, or Firm*—Fish & Richardson P.C.

(57) ABSTRACT

An embodiment of the present invention related to fingerprint sensors is described. The sensor comprises an integrated-circuit chip having a sensitive surface, a substrate provided with electrical connections and wire-bonding wires connecting the chip to the electrical connections. The sensor further includes a molded protective resin at least partly covering the substrate and the chip and completely encapsulating the wire-bonding wires. The resin forms, on at least one side of the chip and at most three sides, a bump rising to at least 500 microns above the sensitive surface, this bump encapsulating the wire-bonding wires and constituting a guide for a finger, the fingerprint of which it is desired to detect.

14 Claims, 2 Drawing Sheets

ND OF PRODUCING A DIGITAL
METHOD OF PRODUCING A DIGITAL FINGERPRINT SENSOR AND THE CORRESPONDING SENSOR

CROSS-REFERENCE TO RELATED APPLICATIONS

The present Application is based on International Application No. PCT/FR03/01378, filed on May 2, 2003, which in turn corresponds to FR 02/05732 filed on May 7, 2002, and priority is hereby claimed under 35 USC §119 based on these applications. Each of these applications are hereby incorporated by reference in their entirety into the present application.

FIELD OF THE INVENTION

The invention relates to fingerprint sensors, and more particularly to a method of manufacture that minimizes the production costs and makes it easier to use the sensor and to protect the sensor against external attack.

BACKGROUND OF THE INVENTION

A fingerprint sensor is produced from an integrated circuit, in principle based on silicon, comprising especially an array of sensitive spots for generating a representation of the fingerprint of a finger placed directly on the surface of the array. Fingerprint detection may be optical or capacitive or thermal or piezoelectric.

Some sensors operate when a finger is placed statically on the surface of a sensor, the rectangular or square active detection array of which has an area corresponding to the fingerprint area to be detected; other sensors operate by the finger sliding over a sensor, the detection array of which, having a much smaller area than the fingerprint to be detected, is a thin elongate strip.

In both cases, but especially in the case of finger-sliding operation, the integrated circuit must be protected by wear-resistant layers. These layers depend on the type of sensor (for example, if it is an optical sensor, it is obvious that the optional protective layers must be protected by transparent layers). It has been proposed to use protective lacquers or else mineral coatings, such as silicon oxide coatings. Moreover, the integrated-circuit chip forming the core of the sensor must be electrically connected to the outside (especially to supply sources, control circuits and circuits for processing the electrical signals representative of the fingerprint). Given that the finger has to be placed on (or has to slide over) the sensitive surface of the sensor, this surface must remain accessible. This is why, for such sensors, a conventional electrical connection solution is adopted, using bonded flexible wires that connect contact pads on the front face (active face) of the integrated-circuit chip to contact pads located on a surface on which the chip is mounted. In integrated-circuit applications other than sensors (for example, microprocessors, memories, etc.), these wires are conventionally protected by a thick protective layer, deposited or overmolded, which encapsulates the chip and its wires.

SUMMARY OF THE INVENTION

It is an object of the invention to propose a method of manufacturing a fingerprint sensor in which the following steps are carried out: a sensor chip is fabricated; this chip is mounted on a substrate; the chip is connected to the substrate by wire-bonding wires; the chip/substrate assembly is placed in a mold; a protective resin is poured into the mold so as to at least partly cover the chip and the substrate and to completely encapsulate the wires, the mold having a shape such that a bump of resin, projecting by at least 500 microns above a sensitive surface of the chip, is formed on at least one side of the chip, this bump protecting the wire-bonding wires and forming a positioning guide for the finger, the fingerprint of which it is desired to detect, so that the latter comes opposite a sensitive surface of the chip when the finger comes against the bump.

Preferably, at least one side of the chip will have no such guiding bump. In the case of detection by the finger sliding over a chip of elongate strip shape, perpendicular to the direction of sliding of the finger, two sides of the chip will have no such guiding bump: a bump will be provided either on one side of the chip or on two opposed sides (these facing each other in the long direction of the strip), but not on the other two sides.

In the case of a capacitive fingerprint sensor, the mold will be such that the sensitive surface of the chip is not covered with resin and the bumps will rise directly above the surface of the chip, leaving the sensitive surface of the chip free.

However, it is advantageous in the case of a thermal or piezoelectric sensor to cover the sensitive surface with a thin, molded resin layer that protects this surface (preferably a uniform layer approximately 20 to 60 microns in thickness); the bumps will rise a few millimeters above this thin resin layer.

The integrated-circuit chip thus encapsulated therefore includes, right from its fabrication, an ergonomic element (a finger-guiding element), so that this chip can be installed directly in applications without it being necessary to design the environment for these applications using specific guiding elements. For example, to install this sensor on a computer keyboard, it is unnecessary to redesign the keyboard casing. The sensor can be installed on a flat surface of this keyboard.

The substrate may be rigid or flexible and will include electrical contacts left free (not covered with molded resin) for connecting the sensor to the outside.

Preferably, the encapsulation by resin molding will be carried out on several chips simultaneously, the individual sensors thus encapsulated being subsequently detached from one another.

If a thin molded resin layer covers the active surface of the sensor, it is preferred to install, on the front face of the integrated-circuit chip, before the chip is placed in the mold, spacers of calibrated height, against which the bottom of the mold will bear, in order for the thickness of resin that will cover the active surface of the sensor to be perfectly defined. These spacers are preferably placed all around this active surface so as not to impede the operation of the fingerprint detection. They may consist of bumps, a few tens of microns in height, formed during the actual fabrication of the chip and consequently integrated into the chip. They may also consist of balls or cylinders of calibrated diameter, these being laid on the surface of the chip in areas precoated with adhesive.

To summarize, the aim of the invention is to end up with a fingerprint sensor comprising a sensor chip having a sensitive surface, a substrate provided with electrical connections and wire-bonding wires connecting the chip to the electrical connections, characterized in that it includes a molded protective resin at least partly covering the substrate and the chip and completely encapsulating the wire-bonding wires, and in that the resin forms, on at least one side of the chip and at most on three sides, a bump rising to at least 500 microns above the sensitive surface, this bump encapsulating the wire-bonding wires and constituting a guide for a finger, the fingerprint of which it is desired to detect. For a sensor designed to detect a fingerprint when a finger is slid perpendicular to the long direction of the chip, the latter being in the form of a strip, a resin bump is provided on at most two sides of the chip, these sides being the short sides.

BRIEF DESCRIPTION OF DRAWINGS

Other features and advantages of the invention will become apparent on reading the detailed description that follows, this being given with reference to the appended drawings, in which.

DETAILED DESCRIPTION OF PREFERRED EMBODIMENT

Figure 1:
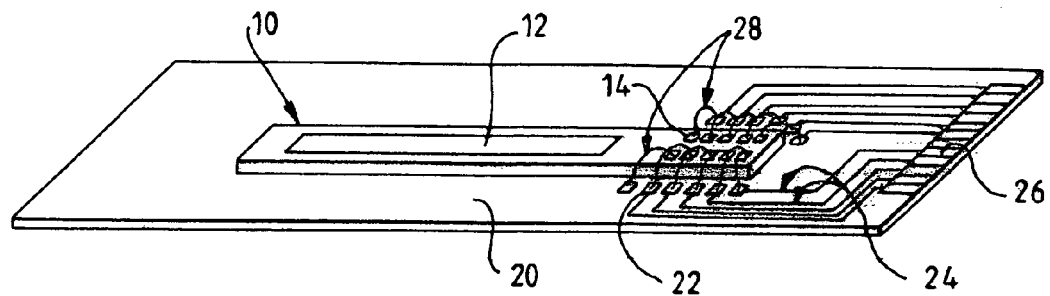
FIG. 1 shows the fingerprint sensor before encapsulation.

FIG. 1 shows an example of a fingerprint sensor produced from an integrated-circuit chip 10 in the form of an elongate strip (i.e. the length is much greater than the width) over which a finger has to be slid in order to detect, in succession, finger image portions as the finger progressively slides over the surface of the chip. The finger is slid perpendicular or approximately perpendicular to the length of the strip. The chip comprises an array of several rows (for example 5 to 10 rows) of many elementary detectors (for example, from about one hundred to several hundred elementary detectors per row) and each image therefore comprises several rows of many dots. By correlation of the partial images obtained in succession as the finger is moved along, an overall image of the fingerprint that has traveled over the surface of the sensor is reconstructed. The sensor may be a thermal sensor (measuring differences in heat exchange between the finger and a detector depending on whether a ridge or a valley of a fingerprint is opposite an elementary detector). It may also be a piezoelectric sensor (measuring the difference in pressure exerted depending on whether a ridge or a valley is present) or a capacitive sensor (measuring the difference in capacitance depending on whether a ridge or a valley is present); finally, it may be an optical sensor (measuring the difference in reflected light intensity).

In the example shown, the elongate chip 10 has a sensitive active region 12 that is subjected to the influence of the fingerprint relief and consists essentially of an array of several rows of elementary detectors, and a peripheral region comprising, on the one hand, circuits associated with the array (supply circuit, control circuit, circuit for receiving signals delivered by the array) and, on the other hand, conducting contact pads 14 used for connecting the chip to the outside.

The chip is conventionally mounted on a substrate 20 which itself includes corresponding conducting pads 22, electrical connections 24 connected to these pads 22, and contacts or pins 26 intended for connecting the chip/substrate assembly to elements external to the actual sensor (for example in order to communicate with a computer to which it will be desired to transfer, for processing and use, the electrical signals allowing the detected fingerprint image to be displayed).

The chip is mounted on this substrate 20 via its rear, inactive face; the front, sensitive face remains accessible to the finger. The most conventional method of connection, namely wire bonding, is preferably used to connect the pads 14 on the chip to the pads 22 on the substrate. The wire-bonding wires are denoted by 28 in FIG. 1.

The encapsulation operation after the chip 10 has been mounted on the substrate 20 consists in mounting the integrated-circuit chip/substrate assembly in a mold into which a resin for protecting the delicate parts of the assembly is injected. These delicate parts include, of course, the wire-bonding wires 28. The resin is liquid and cures in the mold, forming a solid. Conventionally, it is a two-component resin.

The shape of the mold is designed so that the solidified resin forms one or more relatively thick bumps (in practice, the thickness is greater than that strictly needed to simply protect the chip and its wire-bonding wires 28) above the sensitive surface of the chip, on at least one side of the chip. The thickness of the bumps is preferably about one millimeter, but no more, above the surface on which the finger will rest during use. This means that, if the surface of the chip remains uncovered with resin, the bumps project by about one millimeter from the upper surface of the chip, but if the surface of the active part of the chip is itself covered with a thin resin layer on which the finger will press, the bumps will project one millimeter above this layer.

Figure 2:
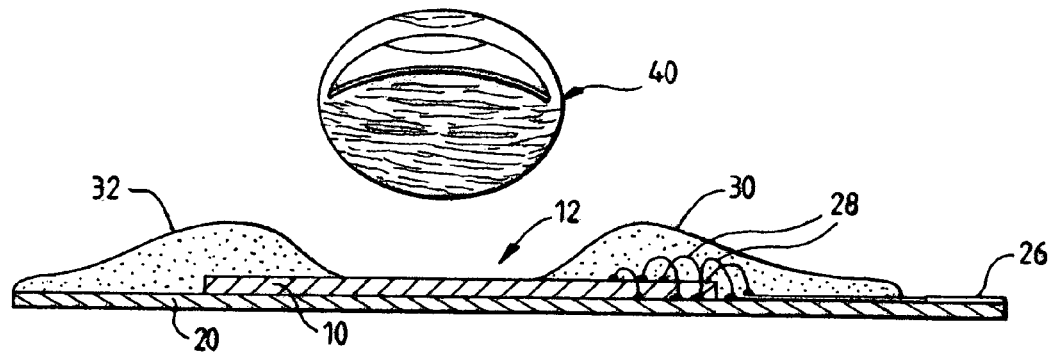
FIG. 2 shows, in cross section, the principle of the sensor encapsulation.

FIG. 2 shows, in cross section, the chip 10 and its substrate 20 both encapsulated in the resin, which has two bumps, one on each side of the elongate chip, on the short sides. In this example, all the wire-bonding wires 28 for connecting the chip to the substrate are located on just one short side of the elongate chip. A resin bump 30 covers and protects them. This bump constitutes the main element for positioning and guiding the finger in its sliding movement transverse to the long direction of the strip. An optional second bump 32 may be formed, by molding, on the other short side of the strip. The finger 40 is then placed between the two bumps. The sensitive upper surface of the chip 10 is not covered with resin in this embodiment shown in FIG. 2.

In the case of a sensor over which the finger slides, at most two bumps are provided. In the case of a sensor on which the finger remains static, with a square or rectangular chip, but not one in the form of a strip, up to three bumps may be provided, allowing three sides of the active surface to be defined, the finger being able to bear on two or three of these bumps.

The external connection contacts 26 are not covered with the molding resin. In the example shown in FIGS. 1 and 2, these contacts are on the upper surface of the substrate 20. The pads 22 on the substrate, the connections 24 and the contacts 26 are produced as a metal film covering the surface of the substrate, which is made of a plastic or a ceramic. The contacts 26 are located on the top side of the substrate (that on which the chip is mounted). However, it is also possible to use other types of connection and in particular connections via beam leads. This involves a rigid conducting leadframe which itself constitutes simultaneously the substrate on which the chip is mounted, the pads 22, the connections 24 and the contacts 26. In this case, it will be understood that the contacts 26 may be accessible via the rear of the substrate, rather than via the front. In yet other embodiments, the contacts 26 may be accessible via the rear of the substrate. This is the case, for example, if the substrate is a multilayer substrate that includes interconnection conductors both on its front surface and on its rear surface with conducting vias between the two.

Figure 3:
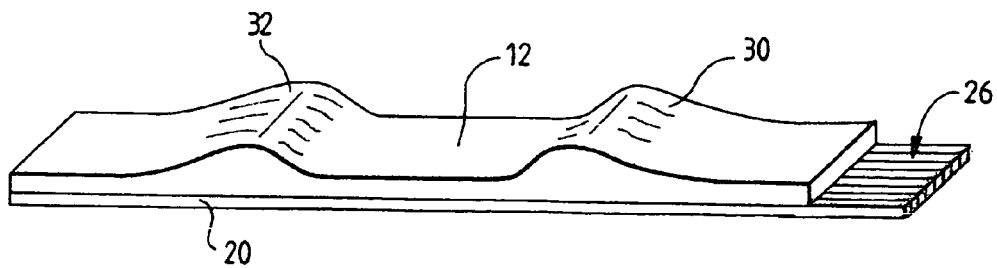
FIG. 3 shows the encapsulated sensor, in perspective.

FIG. 3 shows in perspective an example of an embodiment in which the conducting contacts 26 are made in the form of a male connector. For connecting the substrate to the outside, a complementary connector may be plugged into the contacts 26 or applied against these contacts, depending on the configuration of the latter.

Figure 4:
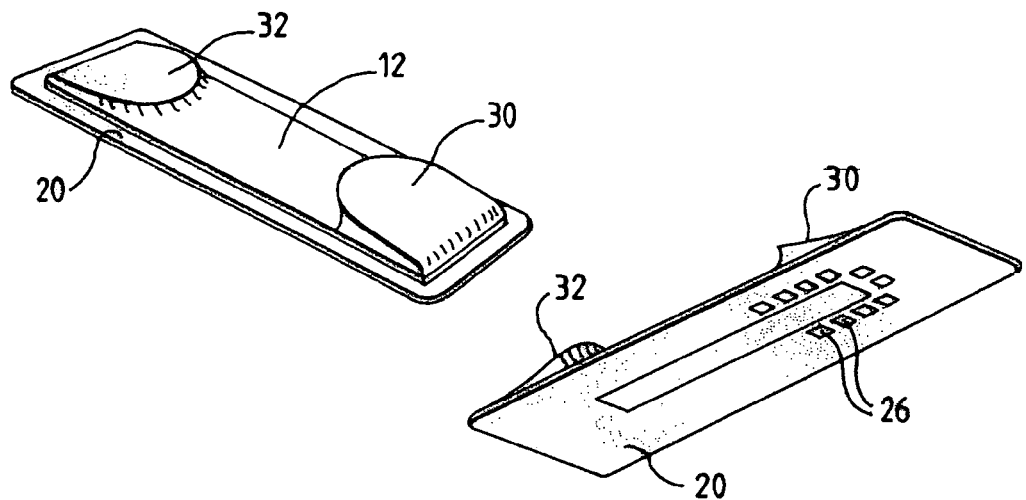
FIG. 4 shows in perspective, seen from above and from below, an alternative embodiment of the sensor.

FIG. 4 shows in perspective another example of an embodiment in which the connection contacts 26 on the substrate are located on the underside of the substrate, the latter being formed by a multilayer structure. FIG. 4 shows bumps 30 and 32 differing in shape from that of FIG. 3, but fulfilling the same function of protecting the wire-bonding wires and of guiding the finger.

Figure 5:
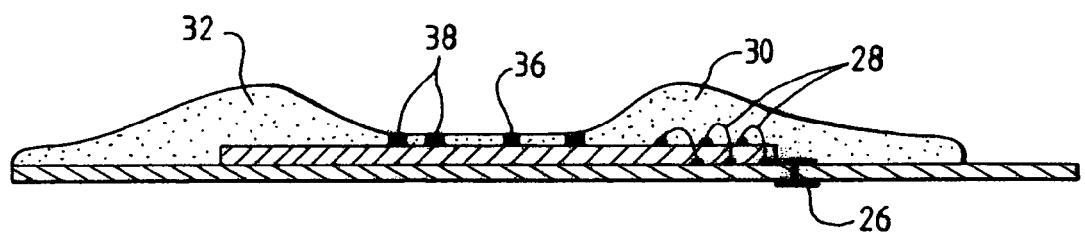
FIG. 5 shows, in cross section, an embodiment with the active surface of the sensor coated with a thin, molded resin layer.

FIG. 5, in which connection contacts 26 have also been provided on the underside of the substrate 20, shows, in cross section, another embodiment in which the resin 36 covers, as a thin layer a few tens of microns in thickness, the active surface of the chip between the bumps 30 and 32. In order to define this small thickness, spacers 38 are preferably provided on the surface of the chip, these spacers having the desired thickness. The bottom of the mold bears against the spacers and the liquid resin can be injected into the gap that is thus left between the front surface of the chip and the bottom of the mold. This embodiment is advantageous in the case of a thermal sensor, the surface of the chip of which cannot in practice be covered with a silica passivation layer, as it would be in the case, for example, of an optical sensor. The spacers 38 may be produced in several ways. They are placed not directly in the active region of the sensor, but in a peripheral region of the front face of the chip. In one example, they consist of glass balls or cylinders of calibrated diameter, placed on spots of adhesive deposited beforehand around the periphery of the active region. The balls may be made of glass. The cylinders may be made of glass fiber fragments ranging from about ten to several tens of microns in diameter. In another example, the spacers are integrated into the surface of the chip, for example in the form of localized deposits of metal. These deposits may be formed electrolytically.

The sensors are preferably manufactured by molding a batch of several sensors on a common substrate. The individual sensors, each comprising a respective chip and each provided with their bumps and their connections, are detached from one another after molding. Molding onto a continuous ribbon of substrates attached to one another is the preferred solution. Depending on the applications, several chips may be provided in one and the same sensor, these being encapsulated in just one operation. The resin used may be a transparent resin, in particular when the sensor is an optical sensor and when the active surface is covered with resin.

The invention claimed is:

1. A method of manufacturing a fingerprint sensor, the sensor designed to allow fingerprint detection by a finger sliding over an active surface, the method comprising the following steps:
   fabricating a sensor chip, the chip being in the form of an elongate strip having two short sides;
   mounting the chip on a substrate;
   connecting the chip to the substrate by wire-bonding wires placed on one short side of the chip; placing the chip/substrate assembly in a mold; and
   pouring a protective resin into the mold so as to at least partly cover the substrate and the chip and to completely encapsulate the wires, the mold having a shape such that a bump of resin, projecting by at least 500 microns above a sensitive surface of the chip, is formed on at least one side of the chip, the bump protecting the wire-bonding wires and forming a positioning guide for the finger, the fingerprint of which is desired to be detected, so that the latter moves opposite a sensitive active surface of the chip when the finger slides against the bump.

2. The method as claimed in claim 1, wherein the two short sides of the chip are provided with a guiding bump, the mold being shaped so that the other two sides of the chip do not have a bump.

3. The method as claimed in claim 1, wherein the mold is shaped so that the active surface of the chip is covered with a thin, molded resin layer that protects this surface.

4. The method as claimed in claim 3, wherein, before the substrate is placed in the mold, spacers of calibrated height, against which the bottom of the mold will bear, are placed on the front face of the integrated-circuit chip, before the chip is placed in the mold, in order for the thickness of resin that will cover the sensitive surface of the sensor to be perfectly defined.

5. The method as claimed in claim 3, wherein the thickness of the spacers above the sensitive surface of the chip ranges from about 10 microns to several tens of microns.

6. The method as claimed in claim 1, wherein the bump is less than one millimeter in height.

7. A fingerprint sensor comprising:
   a sensor chip in the form of an elongate strip having two short sides and having a sensitive surface; and
   a substrate provided with electrical connections and wire-bonding wires connecting a short side of the chip to the electrical connections, the long sides having no wire-bonding wires, wherein the sensor chips includes a molded protective resin at least partly covering the substrate and the chip and completely encapsulating the wire-bonding wires, and the resin forming, on at least one side of the chip and at most on two sides, a bump rising to at least 500 microns above the sensitive surface, the bump encapsulating the wire-bonding wires and constituting a guide for a finger, the fingerprint of which is desired to be detected when the finger is slid over the sensor perpendicular to the long direction of the chip.

8. The sensor as claimed in claim 7, wherein the bump is less than one millimeter above the height of the sensitive surface.

9. The method as claimed in claim 2, wherein the mold is shaped so that the active surface of the chip is covered with a thin, molded resin layer that protects this surface.

10. The method as claimed in claim 4, wherein the thickness of the spacers above the sensitive surface of the chip ranges from about 10 microns to several tens of microns.

11. The method as claimed in claim 2, wherein the bump is less than one millimeter in height.

12. The method as claimed in claim 3, wherein the bump is less than one millimeter in height.

13. The method as claimed in claim 4, wherein the bump is less than one millimeter in height.

14. The method as claimed in claim 5, wherein the bump is less than one millimeter in height.

* * * * *

UNITED STATES PATENT AND TRADEMARK OFFICE
CERTIFICATE OF CORRECTION

| | | |
|---|---|---|
| PATENT NO. | : 7,393,711 B2 | |
| APPLICATION NO. | : 10/513308 | |
| DATED | : July 1, 2008 | |
| INVENTOR(S) | : Sebastien Bolis | |

It is certified that error appears in the above-identified patent and that said Letters Patent is hereby corrected as shown below:

Title Pg, Item (54) Title and Col. 1, Ln 1-3, correct the title of the invention to:

METHOD OF MANUFACTURING A FINGERPRINT SENSOR AND

CORRESPONDING SENSOR

Signed and Sealed this

Sixteenth Day of September, 2008

JON W. DUDAS
*Director of the United States Patent and Trademark Office*